(12) United States Patent
Myli et al.

(10) Patent No.: US 11,454,440 B2
(45) Date of Patent: Sep. 27, 2022

(54) BUS BAR CONNECTION AND COATING TECHNOLOGY

(71) Applicant: Cardinal CG Company, Eden Prairie, MN (US)

(72) Inventors: Kari B. Myli, Sauk City, WI (US); Keith James Burrows, Mineral Point, WI (US); Darrell Lee Aldrich, Fort Worth, TX (US)

(73) Assignee: CARDINAL CG COMPANY, Eden Prairie, MN (US)

( * ) Notice: Subject to any disclaimer, the term of this patent is extended or adjusted under 35 U.S.C. 154(b) by 711 days.

(21) Appl. No.: 16/510,391

(22) Filed: Jul. 12, 2019

(65) Prior Publication Data
US 2021/0010739 A1     Jan. 14, 2021

(51) Int. Cl.
| | |
|---|---|
| *E06B 3/02* | (2006.01) |
| *F25D 11/00* | (2006.01) |
| *F25D 21/08* | (2006.01) |
| *E06B 3/67* | (2006.01) |
| *F25D 23/02* | (2006.01) |

(Continued)

(52) U.S. Cl.
CPC ............... *F25D 21/08* (2013.01); *E06B 3/02* (2013.01); *E06B 3/6715* (2013.01); *F25D 11/00* (2013.01); *F25D 23/028* (2013.01); *H05K 1/0296* (2013.01); *H05K 1/09* (2013.01); *H05K 2201/0108* (2013.01); *H05K 2201/0175* (2013.01); *H05K 2201/0326* (2013.01)

(58) Field of Classification Search
CPC .......... E06B 3/02; E06B 3/6715; F25D 11/00; F25D 23/028; H05K 1/09; H05K 1/0296
See application file for complete search history.

(56) References Cited

U.S. PATENT DOCUMENTS

| | | |
|---|---|---|
| 3,772,075 A | 11/1973 | Tarnopol et al. |
| 3,911,245 A | 10/1975 | O'Shaughnessy |

(Continued)

FOREIGN PATENT DOCUMENTS

| | | |
|---|---|---|
| CA | 3058945 A1 | 10/2018 |

OTHER PUBLICATIONS

"Window Technologies: (technologies.php), Low Conductance Spacers," retrieved from the Internet on Mar. 29, 2020, webpage, https://www.efficientwindows.org/spacers.php, believed to have been published on or before Jun. 5, 2019, 6 pgs.

(Continued)

*Primary Examiner* — Jeremy C Norris
(74) *Attorney, Agent, or Firm* — Fredrikson & Byron, P.A.

(57) ABSTRACT

The invention provides an IG unit comprising two panes and a between-pane space located between the two panes. A desired surface of a selected one of the two panes bears a coating comprising both a transparent conductive oxide film, and an overcoat film located over the transparent conductive oxide film. The IG unit further comprises a bus bar and a transparent conductor bridge each located over the desired surface. The bus bar is spaced apart from the coating and is connected electrically to the transparent conductive oxide film by virtue of the transparent conductor bridge extending from the bus bar to a top surface of the overcoat film. In some embodiments, the IG unit further comprises a frit located over the desired surface and extending around a perimeter thereof. The bus bar is located over the frit. Certain embodiments provide a refrigerator having a door comprising such an IG unit.

39 Claims, 7 Drawing Sheets

(51) Int. Cl.
*H05K 1/02* (2006.01)
*H05K 1/09* (2006.01)

(56) References Cited

U.S. PATENT DOCUMENTS

| | | |
|---|---|---|
| 4,306,140 A | 12/1981 | Stromquist |
| 6,144,017 A | 11/2000 | Millett et al. |
| 6,148,563 A | 11/2000 | Roche et al. |
| 6,401,399 B1 | 6/2002 | Roche et al. |
| 6,625,875 B2 | 9/2003 | Sol |
| 8,293,344 B2 | 10/2012 | Lemmer et al. |
| 8,304,045 B2 | 11/2012 | Lemmer et al. |
| 8,445,083 B2 | 5/2013 | Lemmer et al. |
| 8,980,386 B2 | 3/2015 | Lemmer et al. |
| 9,085,051 B2 | 7/2015 | Alvarez |
| 9,453,365 B2 | 9/2016 | Myli et al. |
| 9,469,797 B2 | 10/2016 | Lemmer et al. |
| 9,862,640 B2 | 1/2018 | Pfaff et al. |
| 9,902,238 B2 | 2/2018 | Lemmer et al. |
| 10,039,390 B2 | 8/2018 | Artwohl et al. |
| 10,226,986 B2 | 3/2019 | Lemmer et al. |
| 2007/0020465 A1 | 1/2007 | Thiel et al. |
| 2010/0209730 A1 | 8/2010 | Thomsen et al. |
| 2017/0167188 A1 | 6/2017 | Burrows |
| 2019/0040523 A1 | 2/2019 | Ganjoo et al. |
| 2019/0043640 A1 | 2/2019 | Ganjoo et al. |

OTHER PUBLICATIONS

PCT International Search Report and Written Opinion dated Sep. 11, 2020 for related International Application No. PCT/US2020/040085, 10 pgs.

BUS BAR CONNECTION AND COATING TECHNOLOGY

FIELD OF THE INVENTION

The present invention relates generally to a heatable pane having a bus bar connection and a coating. More particularly, the present invention relates to a multiple-pane insulating glazing unit having a heatable pane with a bus bar connected electrically to a transparent conductive coating.

BACKGROUND OF THE INVENTION

Multiple-pane insulating glazing units ("IG units") having both a transparent conductive oxide ("TCO") film and bus bars are known. IG units of this nature are used, for example, in the doors of certain refrigerators. In such IG units, the bus bars are conventionally in contact with the TCO film. In such conventional designs, no overcoat film is provided over the TCO film. These types of arrangements involve the TCO film being exposed, which may be suboptimal for various reasons. For example, without using an overcoat film, it can be difficult to precisely control the stoichiometry of the TCO and achieve exceptional levels of both electrical conductivity and visible transmittance. Moreover, the bus bars in conventional designs are readily visible, and this tends to be objectionable aesthetically.

As set forth in the present disclosure, it would be desirable to provide an IG unit that has both a coating and a bus bar, wherein the bus bar is spaced apart from the coating. It would be particularly desirable to provide such an IG unit where the coating includes a TCO film and an overcoat film. Still further, it would be desirable to provide a bus bar that is connected electrically to the TCO film by virtue of a transparent conductor bridge extending from the bus bar to a top surface of the overcoat film. Additionally or alternatively, it would be desirable to provide an IG unit having a frit, wherein the bus bar is concealed behind the frit.

SUMMARY OF THE INVENTION

In some embodiments, the invention provides a multiple-pane insulating glazing unit comprising two panes and a between-pane space. The between-pane space is located between the two panes. A desired surface of a selected one of the two panes bears a coating comprising both a transparent conductive oxide film and an overcoat film. The overcoat film is located over the transparent conductive oxide film. The multiple-pane insulating glazing unit further comprises a bus bar and a transparent conductor bridge each located over the desired surface. The bus bar is spaced apart from the coating. The bus bar is connected electrically to the transparent conductive oxide film by virtue of the transparent conductor bridge extending from the bus bar to a top surface of the overcoat film.

Certain other embodiments of the invention provide a multiple-pane insulating glazing unit comprising two panes and a between-pane space. The between-pane space is located between the two panes. A desired surface of a selected one of the two panes bears a coating comprising both an indium tin oxide film and an overcoat film. The overcoat film is located over the indium tin oxide film. The multiple-pane insulating glazing unit further comprises a bus bar and a transparent conductor bridge each located over the desired surface. The bus bar is spaced apart from the coating. The bus bar is connected electrically to the indium tin oxide film by virtue of the transparent conductor bridge extending from the bus bar to a top surface of the overcoat film. The multiple-pane insulating glazing unit further comprises a frit. The frit is located over the desired surface and extends around a perimeter thereof. The bus bar is located over the frit.

Still other embodiments of the present invention provide a refrigerator having a door comprising a multiple-pane insulating glazing unit. The refrigerator has a refrigerated interior environment. The door has an open configuration and a closed configuration. The multiple-pane insulating glazing unit has an interior face and an exterior face. The interior and exterior faces are opposed, such that when the door is in the closed configuration the interior face is exposed to the refrigerated interior environment while the exterior face is exposed to an ambient environment. The multiple-pane insulating glazing unit comprises two panes and a between-pane space. The between-pane space is located between the two panes. A desired surface of a selected one of the two panes bears a coating comprising both a transparent conductive oxide film and an overcoat film. The overcoat film is located over the transparent conductive oxide film. The multiple-pane insulating glazing unit further comprises a frit, a bus bar, and a transparent conductor bridge each located over the desired surface. The frit extends around a perimeter of the desired surface. The bus bar is located over the frit and is spaced apart from the coating. The bus bar is connected electrically to the transparent conductive oxide film by virtue of the transparent conductor bridge extending from the bus bar to a top surface of the overcoat film.

DETAILED DESCRIPTION OF PREFERRED EMBODIMENTS

The following detailed description is to be read with reference to the drawings, in which like elements in different drawings have like reference numerals. The drawings, which are not necessarily to scale, depict selected embodiments and are not intended to limit the scope of the invention. Skilled artisans will recognize that the examples provided herein have many useful alternatives that fall within the scope of the invention.

The invention involves a coated substrate. A wide variety of substrate types are suitable for use in the present invention. In some embodiments, the substrate is a sheet-like substrate having generally opposed first and second major surfaces.

For many applications, the substrate will comprise a transparent (or at least translucent) material, such as glass or clear plastic. For example, the substrate is a glass sheet (e.g., a glass pane) in certain embodiments. A variety of known glass types can be used, such as soda-lime glass. In some cases, it may be desirable to use "white glass," a low iron glass, etc. In certain embodiments, the substrate is part of a refrigerator door (e.g., is part of an IG unit of a refrigerator door).

Substrates of various sizes can be used in the present invention. Commonly, large-area substrates are used. Certain embodiments involve a substrate having a major dimension (e.g., a length or width) of at least about 0.5 meter, preferably at least about 1 meter, perhaps more preferably at least about 1.5 meters (e.g., between about 1.5 meters and about 2.0 meters). Substrates having a major dimension of greater than about 2.0 meters, or of less than about 0.5 meters, are also anticipated.

Substrates of various thicknesses can be used in the present invention. In some embodiments, the substrate (which can optionally be a glass sheet) has a thickness of about 1-8 mm. Certain embodiments involve a substrate with a thickness of between about 2.3 mm and about 4.8 mm, and perhaps more preferably between about 2.5 mm and about 4.8 mm. In one particular embodiment, a sheet of glass (e.g., soda-lime glass) with a thickness of about 3 mm is used.

Figure 1:
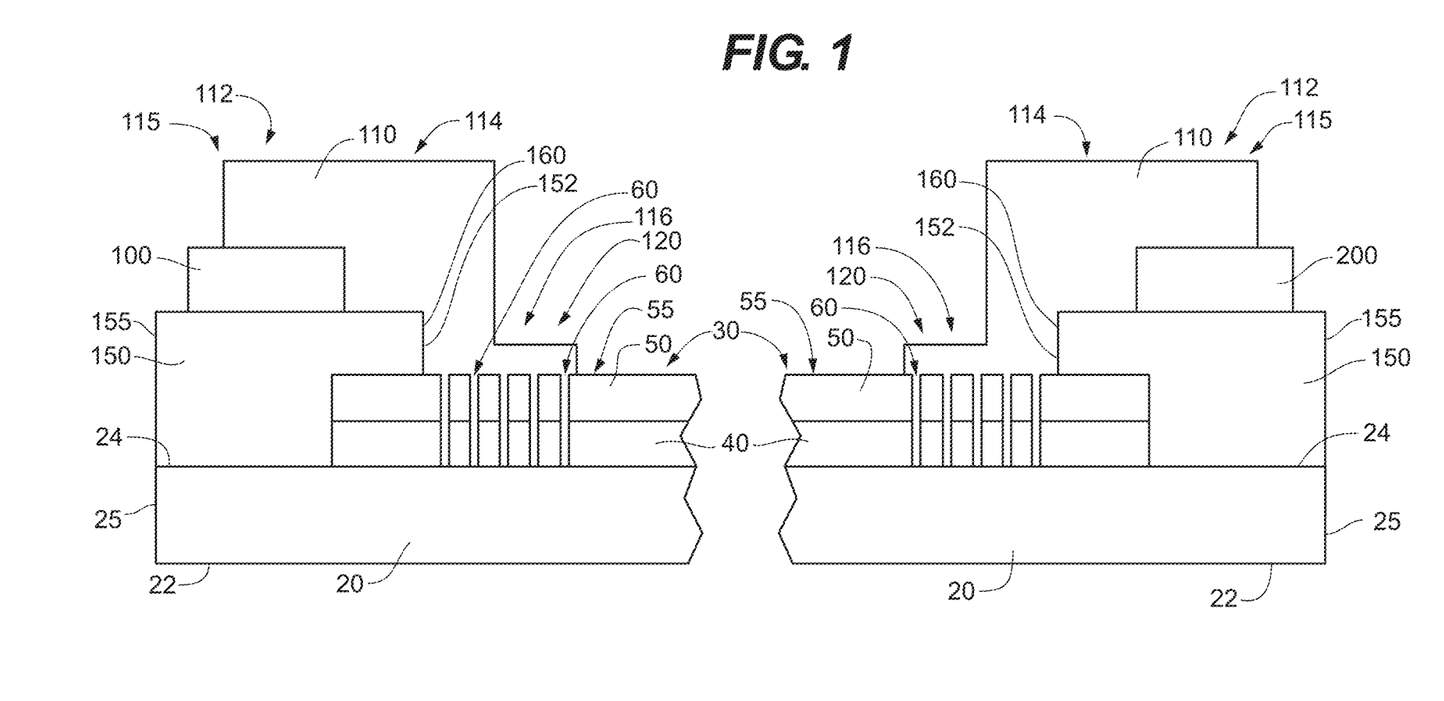
FIG. 1 is a partially broken-away schematic cross-sectional view of a coated pane in accordance with certain embodiments of the present disclosure.
Figure 2:
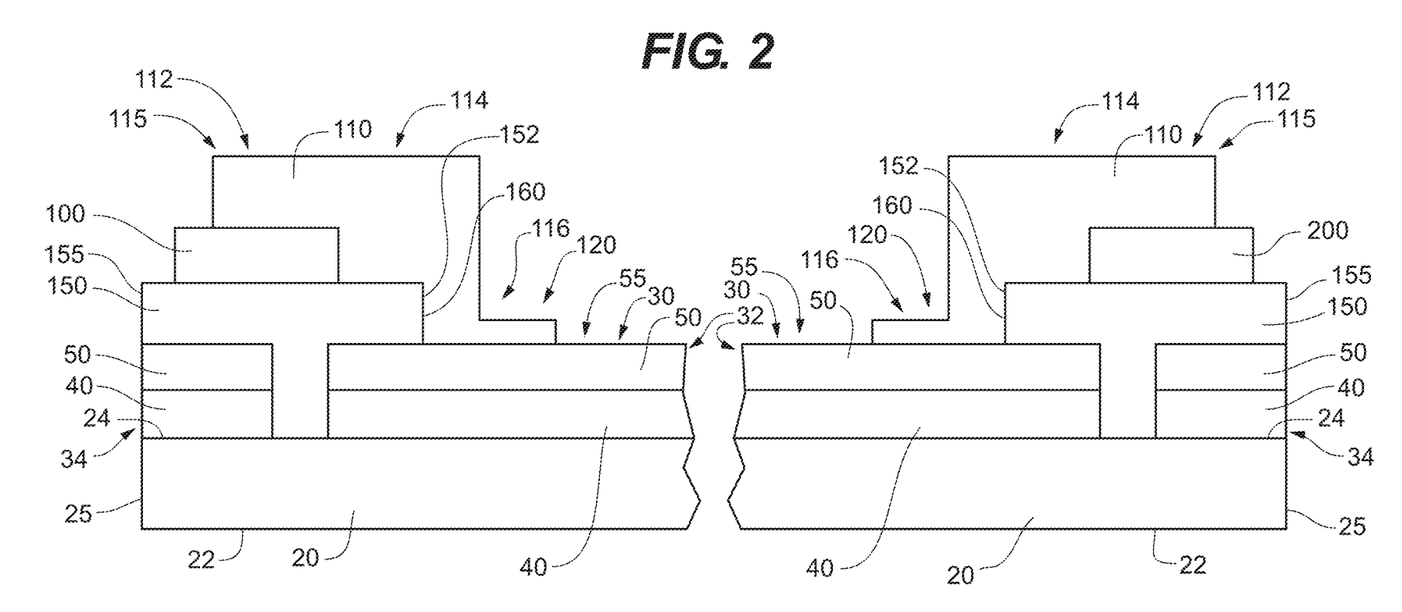
FIG. 2 is a partially broken-away schematic cross-sectional view of a coated pane in accordance with certain other embodiments of the present disclosure.

Referring to the drawings, and in particular, FIGS. 1 and 2, there is shown a coated pane 20 of the present disclosure generally represented by reference numeral 20. In more detail, the pane 20 is a heatable pane. The pane 20 has opposed surfaces 22 and 24, which preferably are opposed major surfaces.

In some embodiments, the invention provides the pane 20 in monolithic form. In other embodiments, the pane 20 is part of an IG unit. A desired surface 24 of the pane 20 bears a coating 30 comprising both a transparent conductive oxide ("TCO") film 40 and an overcoat film 50. The overcoat film 50 is located over (optionally directly over) the transparent conductive oxide film 40. The pane 20 further comprises a bus bar 100 and a transparent conductor bridge 110 both located over the desired surface 24. The bus bar 100 is spaced apart from the coating 30. The bus bar 100 is connected electrically to the transparent conductive oxide film 40 by virtue of the transparent conductor bridge 110 extending from the bus bar 100 to a top surface 55 of the overcoat film 50. Various features, configurations, dimensions, and properties of these elements are described below with reference to embodiments where the pane 20 is part of an IG unit.

In many embodiments, the pane 20 is part of a multiple-pane insulating glazing unit ("IG unit"). The IG unit 10 comprises two panes 20, 27 and a between-pane space, which is located between the two panes. The two panes comprise a first pane 20 and a second pane 27. A spacer 21 is commonly provided that is located between (i.e., so as to separate) the two panes. In some cases, the spacer 21 comprises a foam or an elastomer. In other cases, the spacer 21 comprises a metal. Various conventional spacers can be used. The spacer 21 can be secured between the two panes using an adhesive or a seal. In some cases, an end sealant is also provided. Various conventional sealant systems can be used.

The IG unit 10 may have more than two panes and more than one between-pane space. For example, the IG unit may be a triple glazing having three panes and two between-pane spaces. Thus, while some of the following discussion refers to two panes and a between-pane space, it is to be appreciated that the IG unit may include additional panes and between-pane spaces.

In certain embodiments, the between-pane space is filled with an insulative gas mix, such as a mix of 90% argon and 10% air. This, however, is not required. For example, the IG unit may alternatively be filled with air or a desired single gas. In other embodiments, the IG unit 10 is a vacuum IG unit. In such embodiments, the two panes may be held apart by a plurality of spacers, which may take the form of small pillars or the like. If desired, part of all of the distance between the panes may be filled with an aerogel.

In IG unit embodiments, a desired surface 24 of a selected one of the two panes bears a coating 30 comprising both a TCO film 40 and an overcoat film 50. The overcoat film 50 is located over the TCO film 40. In some cases, the overcoat film 50 is located directly over (so as to be in contact with) the TCO film 40. In such cases, the overcoat film 50 may be a single layer having an inner face contacting the TCO film 40 and an exposed outer face. Furthermore, the TCO film 40 can optionally be a single layer.

Examples of suitable coatings that can be used as coating 30 of the present disclosure are described in U.S. Pat. Nos. 9,862,640 and 9,453,365, the teachings of which concerning the coatings of those patents are hereby incorporated herein by reference.

In certain embodiments, the present coating 30 includes, in sequence from surface 24 outwardly, an optional base film (not shown), the TCO film 40, and the overcoat film 50. The optional base film, TCO film 40, and overcoat film 50 can be provided in the form of discrete layers, thicknesses of graded film, or a combination of both including at least one discrete layer and at least one thickness of graded film. While both the TCO film 40 and the overcoat film 50 are shown as single layers, either or both can alternatively comprise a plurality of layers. Preferably, all the films of the coating 30 are oxide, nitride, or oxynitride films. In some cases, all the films of the coating 30 are sputtered films.

When provided, the optional base film can comprise, consist essentially of, or consist of silica, alumina, or a mixture of both. In some cases, silicon oxynitride (optionally containing some aluminum) is used. Silicon nitride (optionally containing some aluminum) may also be used. Combinations of these materials can be used as well. Other films known to be useful as sodium ion diffusion barriers can also be used.

In other embodiments, as shown for example in FIGS. 1 and 2, the TCO film 40 is directly on (i.e., in contact with) the desired surface 24. In embodiments of this nature, there is of course no base film.

In preferred embodiments, the TCO film 40 comprises, consists essentially of, or consists of indium tin oxide. In alternate embodiments, zinc aluminum oxide, SnO:Sb, SnO:F, or another known TCO material is used. Preferably, the TCO is a sputtered film that includes tin (e.g., such as ITO film or a film comprising tin oxide together with antimony, fluorine, or another dopant). In some cases, the TCO film 40 includes carbon nanotubes.

Although a TCO film is described herein, skilled artisans will appreciate that a metallic transparent conductor film can alternatively be used. In such instances, the TCO film 40 is omitted and replaced with a metal film, such as a silver film. This can optionally be the case for any embodiment of the present disclosure. For each reference to (and each description relating to) TCO film 40 in the present detailed description section, as well as for each figure of the present disclosure showing TCO film 40, it is to be understood that alternative embodiments provide a silver or other metal film in place of the TCO film 40. In such alternative embodiments, for example, the bus bar preferably will be connected electrically to the metal film by virtue of the transparent conductor bridge extending from the bus bar to a top surface of the overcoat film. Furthermore, there can optionally be a conventional thin blocker layer (e.g., comprising one or more of titanium, niobium, nickel, and aluminum) deposited in the form of metal or suboxide film directly over the metal film.

In preferred embodiments, the overcoat film 50 comprises transparent dielectric film. The overcoat film 50 can optionally be formed of oxide film, nitride film, and/or oxynitride film. In some cases, the overcoat film 50 comprises, consists essentially of, or consists of a nitride, such as silicon nitride, aluminum nitride, or a mixture of both. In other cases, oxynitride film (e.g., silicon oxynitride, optionally including some aluminum) is used. In preferred embodiments, the overcoat film 50 comprises (or consists essentially of) silicon oxynitride, and the TCO film 40 comprises (or consists essentially of) indium tin oxide. When provided, the silicon oxynitride can include aluminum.

In preferred embodiments, the TCO film 40 has a thickness in a range of from about 100 Å to about 1,350 Å. In some cases, the TCO film 40 has a thickness of greater than 100 Å but less than 1,000 Å. For example, the TCO film 40 can optionally have a thickness of greater than 100 Å but less than 500 Å (e.g., less than 450 Å, less than 400 Å, less than 350 Å, less than 300 Å, less than 250 Å, or even less than 200 Å). In combination with the TCO film 40 having a thickness within any range noted in this paragraph, the TCO film 40 can optionally comprise, consist essentially of, or consist of ITO. This can optionally be the case for any embodiment of the present disclosure.

In certain embodiments (e.g., where the overcoat film 50 comprises transparent dielectric film), the overcoat film 50 has a thickness in a range of from about 50 Å to about 900 Å. In some cases, the thickness of the overcoat film 50 is greater than 50 Å but less than 300 Å, such as less than 250 Å, less than 200 Å, less than 100 Å, or even less than 75 Å. In combination with the overcoat film 50 having a thickness with any range noted in this paragraph, the overcoat film 50 can optionally comprise, consist essentially of, or consist of oxide, nitride, and/or oxynitride film. This can optionally be the case for any embodiment of the present disclosure, such as those described in the immediately preceding paragraph.

In one non-limiting example, the TCO film 40 has a thickness of about 1,250 Å while the overcoat film 50 has a thickness of about 800 Å. In another non-limiting example, the TCO film 40 has a thickness of about 100 Å while the overcoat film 50 has a thickness of about 50 Å. In either of these examples, the TCO film can optionally be ITO while the overcoat film is SiON.

In some embodiments, the selected pane 20 is heated prior to film deposition, during deposition, or both. Additionally or alternatively, the coated pane 20 can be heat treated after being coated. If desired, post-deposition heat treatment can be performed in air due to the presence of the overcoat film 50. When the coated pane 20 is heat treated, defects in the film can be healed and improvement of crystalline structure can occur in the TCO film 40 without an uncontrollable change in the chemistry of the TCO. The preferred overcoat film 50 can prevent oxygen from reaching the TCO film 40 and causing an uncontrollable change in its chemistry during heat treatment.

In certain embodiments, the selected pane 20 is a glass pane, such that the coating 30 is provided on the glass pane. In some cases, this coated glass pane is heat treated through a process selected such that the coated glass can be cut readily by conventional glass cutting techniques even after the heat treatment. This, for example, can involve using lower temperature for conversion so as to maintain the stress in the glass such that it remains cut-able even after the heat treatment. A variety of known heat-treatment techniques can be used.

Preferably, the TCO film 40 has a sheet resistance of between 10 ohms/square and 2,000 ohms/square. If the TCO film 40 is heat treated, its sheet resistance will depend on how long the TCO film 40 is heated and the temperature profile used. In some embodiments, the sheet resistance of the TCO film 40 is less than 25 ohms/square or less than 20 ohms/square (e.g., less than 15 ohms/square, less than 14 ohms/square, or even less than 13 ohms/square). The sheet resistance of the TCO film 40 can be measured in standard fashion using a non-contact sheet resistance meter. Other methods known in the art as being useful for determining sheet resistance can also be used. The TCO film 40 preferably has a sheet resistance within the broad range given in the first sentence of this paragraph together with having a thickness within any one of the ranges noted above. In some cases, the sheet resistance can also be within any one or more of the ranges noted in the third sentence of this paragraph.

Preferably, the coating 30 is formed of materials and made by a process that allow the coated pane 20 to have a haze level of less than 0.5 or less than 0.3 (e.g., less than 0.2, less than 0.1, or even less than 0.09), a roughness $R_a$ of less than about 10 nm, less than about 5 nm, or less than about 3 nm (e.g., less than about 2 nm), and a monolithic visible transmission of greater than 75% (perhaps greater than 80%). This can optionally be the case for any embodiment described herein.

Haze can be measured in well-known fashion, e.g., using a BYK Haze-Gard plus instrument. Reference is made to ASTM D 1003-00: Standard Test method for Haze and Luminous Transmittance of Transparent Plastics, the salient contents of which are incorporated herein by reference.

The multiple-pane insulating glazing unit 10 further comprises a bus bar 100 and a transparent conductor bridge 110 each located over the desired surface 24. As shown in FIGS. 1 and 2, the bus bar 100 is spaced apart from the coating 30. The bus bar 100 is connected electrically to the TCO film 40 by virtue of the transparent conductor bridge 110 extending from the bus bar 100 to a top surface 55 of the overcoat film 50. This arrangement allows electrical contact to be made through the overcoat film 50, thereby enabling use of a TCO coating 40 having a better combination of electrical resistivity and visible transmission (as compared with a conventional arrangement where a bus bar is provided directly over a TCO film). In some cases, the thickness of the TCO film 40 is in a range of from 100 Å to 1,350 Å, the thickness of the overcoat film 50 is in a range of from 50 Å to 900 Å, the sheet resistance of the TCO film is between 10 and 2,000 ohms/square (and in some cases, less than 25 ohms/square, or even less than 15 ohms/square), and the monolithic visible transmission of the coated pane 20 is greater than 75% (or even greater than 80%).

A wire or other conventional electrical lead can be attached (e.g., by soldering) to the bus bar 100. The wire or other electrical lead is configured to deliver electric current to the bus bar 100. Thus, when electric current is delivered to the bus bar 100, such current then flows from the bus bar, through the transparent conductor bridge 110, and to the TCO film 40. More will be said of this later.

In certain embodiments, the transparent conductor bridge 110 comprises a transparent conductive oxide. For example, the transparent conductor bridge 110 can optionally comprise tin oxide. Indium tin oxide may be used. SnO:F or SnO:Sb may also be used. However, skilled artisans will appreciate that any TCO can be used for the transparent conductor bridge 110, including any of the transparent conductive oxides discussed above for the TCO film 40.

In preferred embodiments, the transparent conductor bridge 110 has a printed bridge structure overlying both the bus bar 100 and the coating 30. As shown in FIGS. 1, 2, and 5-7, the transparent conductor bridge 110 may have a step-like configuration (e.g., optionally having two steps). In some cases, the transparent conductor bridge 110 is a printed bridge comprising a printed transparent conductive material. As non-limiting examples, the printed bridge structure can comprise an inkjet-printed or a screen-printed bridge structure. In cases where the transparent conductor bridge 110 is inkjet printed, any suitable inkjet printer (e.g., the TECGlass Vitro Jet) can be used. In some cases, the same printer is used to apply (e.g., to inkjet print) the transparent conductor bridge 110 and a frit 150, which is described below.

In preferred embodiments, the transparent conductor bridge 110 has a thickness that is greater than the thickness of the TCO film 40. This can optionally be the case for any embodiment of the present disclosure. In some cases, the thickness of the transparent conductor bridge 110 is in a range of from 0.5-5 microns (e.g., from 1-5 microns, such as from 1-4 microns, or from 0.5-4 microns, or even from 0.5-3 microns). These thickness ranges for the transparent conductor bridge 110 can optionally be provided in any embodiment of the present disclosure.

In preferred embodiments, the TCO film 40 has a thickness in a range of from about 100 Å to about 1,350 Å. In some cases, the TCO film 40 has a thickness of greater than 100 Å but less than 1,000 Å. For example, the TCO film 40 can optionally have a thickness of greater than 100 Å but less than 500 Å (e.g., less than 450 Å, less than 400 Å, less than 350 Å, less than 300 Å, less than 250 Å, or even less than 200 Å). In combination with the TCO film 40 having a thickness within any range noted in this paragraph, the TCO film 40 can optionally comprise, consist essentially of, or consist of ITO. This can optionally be the case for any embodiment of the present disclosure.

Preferably, an outer region 115 of the transparent conductor bridge 110 is in contact with the bus bar 100, while an inner region 120 of the transparent conductor bridge 110 is in contact with the top surface 55 of the overcoat film 50. In preferred embodiments, the overcoat film 50 is a transparent dielectric film, such that the transparent conductor bridge 110 is in contact with underlying transparent dielectric film. As noted above, the overcoat film 50 may be an oxide, nitride, or oxynitride film, such that the transparent conductor bridge 110 is in contact with underlying oxide, nitride, or oxynitride film.

Figure 3:
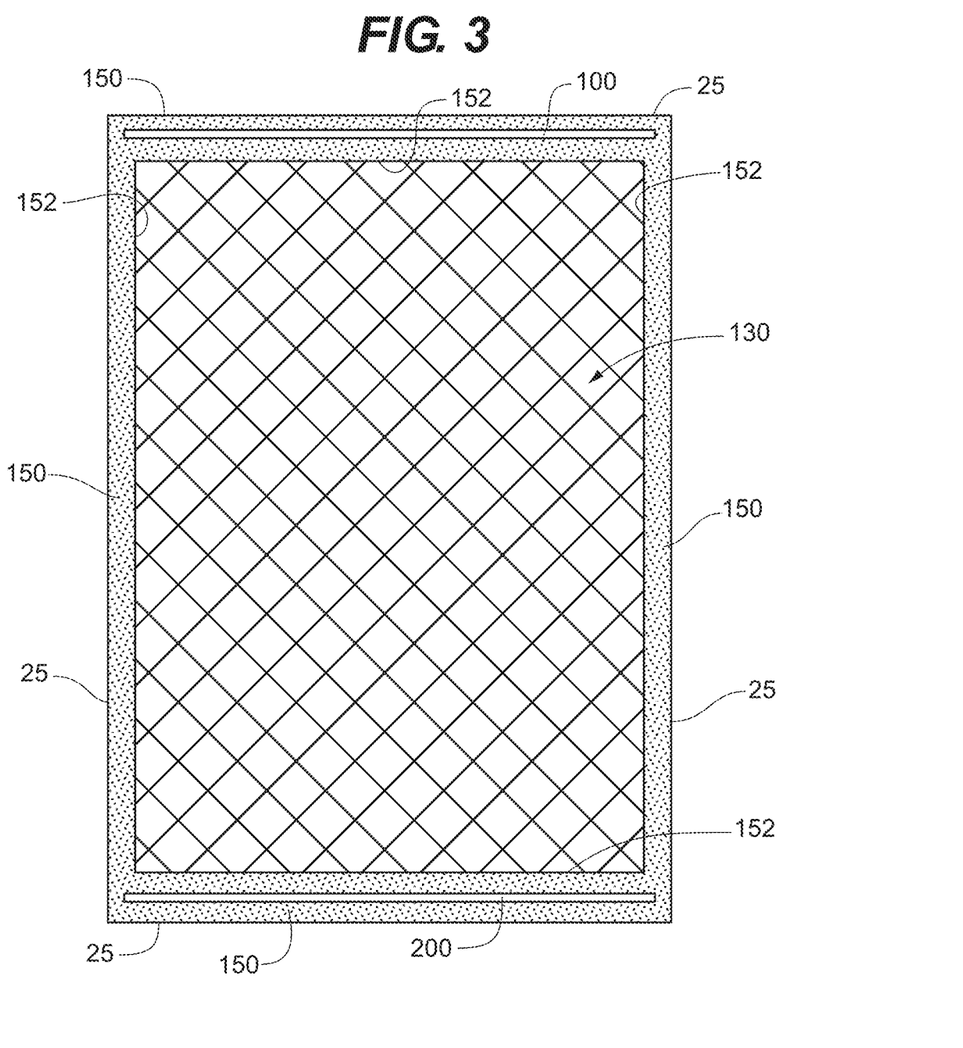
FIG. 3 is a schematic rear view of a coated pane in accordance with certain embodiments of the present disclosure.

In some embodiments, the inner region 120 of the transparent conductor bridge 110 is positioned within a vision area 130 of the multiple-pane insulating glazing unit 10. As used herein, the term "vision area" of the IG unit 10 refers to the area of the IG unit 10 through which a person can see. In FIG. 3, for example, the vision area 130 of the IG unit 10 is shown.

Preferably, the IG unit 10 further comprises a frit 150. In such cases, the frit 150 is located over the desired surface 24 of the pane 20 and extends around a perimeter thereof. In embodiments of this nature, the bus bar 100 can advantageously be located over the frit 150. As shown in FIGS. 1 and 2, the bus bar 100 can optionally be located directly over (i.e., so as to contact) the frit 150.

Typically, the frit 150 extends entirely around the perimeter of surface 24. However, it may alternatively be provided only on opposite sides of surface 24, e.g., one section of frit may be located beneath bus bar 100 while another section of frit is located beneath bus bar 200.

When provided, the frit 150 has two opposed lateral sides 155, 160. In preferred embodiments, the bus bar 100 is sized and positioned relative to the frit 150 such that no portion of the bus bar 100 extends laterally beyond either of the two lateral sides 155, 160 of the frit 150. In embodiments of this nature, the bus bar 100 has a lateral width that is either the same as, or less than, a lateral width of the frit 150. Such arrangements allow the bus bar 100 to be hidden from view behind the frit 150. This may be desirable for various reasons, including certain aesthetic reasons.

Preferably, the frit 150 surrounds the vision area 130 of the multiple-pane insulating glazing unit 10. In some embodiments, the frit 150 delineates the vision area 130, e.g., such that the vision area 130 is the area inward from an interior edge 152 of the frit 150. However, this need not be the case in all embodiments. For example, the IG unit 10 can optionally be mounted in a frame, and sometimes when that is the case the frame delineates the vision area 130 (e.g., such that the vision area is the area inward from an interior edge of the frame).

In certain embodiments, the transparent conductor bridge 110 includes a first region 112, a second region 114, and a third region 116. Reference is made to FIGS. 1 and 2. In such embodiments, the first region 112 is in contact with the bus bar 100, the second region 114 preferably is in contact with the frit 150, and the third region 116 is in contact with the top surface 55 of the overcoat film 50. As shown in FIGS. 1 and 2, the first region 112 is part of the outer region 115 of the transparent conductor bridge 110, and the third region 116 is part of the inner region 120 of the transparent conductor bridge 110.

The selected pane 20 has an edge 25 at a perimeter of the desired surface 24. In FIGS. 1 and 2, the first region 112 of the transparent conductor bridge 110 is closer to the adjacent edge 25 of the selected pane 20 than are the second 114 and third 116 regions of the transparent conductor bridge 110. In addition, the second region 114 of the transparent conductor bridge 110 is closer to the adjacent edge 25 of the selected pane 20 than is the third region 116 of the transparent conductor bridge 110.

In preferred embodiments, the bus bar 100 is positioned outside the vision area 130. Advantageously, such positioning conceals the bus bar 100 from view (e.g., when observing pane 20 from the glass side as shown in FIGS. 1 and 2). In some cases, part of the transparent conductor bridge 110 (including, e.g., the first region 112) is positioned outside the vision area 130. In addition, the third region 116 of the transparent conductor bridge 110 can optionally be positioned within the vision area 130.

The coating 30 may include extremely small defects (e.g., pin holes), as may result from conventional deposition or heat treatment processes. As such, simply heat treating a coated substrate of the nature shown in FIG. 2 may provide sufficient electrical (ohmic) contact between the TCO film 40 and the transparent conductor bridge 110.

In other embodiments, perforations 60 are present in the overcoat film 50 at locations where the transparent conductor bridge 110 contacts the overcoat film 50. Although perforations 60 are not required, it may be desirable to form such perforations 60 so as to provide improved electrical contact between the bus bar 100 and the TCO film 40. As shown in the non-limiting embodiment of FIG. 1, the perforations 60 allow certain portions of the TCO film 40 to be in contact with the transparent conductor bridge 110. The perforations 60 may extend through the overcoat film 50, through the TCO film 40, and to the selected pane 20. In other cases, the perforations may not extend all the way to the pane. For example, they may just extend to the TCO film.

In some cases, the perforations 60 are laser perforations. In other cases, the perforations 60 are mechanically-abraded or chemically-etched areas of the overcoat film 50. Skilled artisans will appreciate that other types of perforations can be used.

When provided, any number and size of perforations 60 can be present in the overcoat film 50. In some cases, the perforations 60 account for from about 1 ppm up to about 50% of the contact area between the transparent conductor bridge 110 and the coating 30.

As shown in FIGS. 1 and 2, the coating 30 preferably is omitted or removed (e.g., edge-deleted or laser isolated) in certain locations so as to prevent electric current from reaching the edge of the IG unit 10. In some cases, localized coating removal is accomplished by grinding, carving, cutting, or laser ablation. Alternatively, the coating 30 may initially be formed only on a central region of the surface 24 (e.g., by masking the edge region during deposition). In the embodiment of FIG. 1, a peripheral region of coating 30 has been removed or omitted. In the embodiment of FIG. 2, once a portion of the coating 30 has been removed, the coating 30 has both a main region 32 and a peripheral region 34 with a gap therebetween. In such cases, the main region 32 of the coating 30 is located inwardly of the gap, whereas the peripheral region 34 of the coating 30 is located outwardly of the gap. Thus, in FIG. 2, the gap between peripheral region 34 and main region 32 prevents electric current from reaching the peripheral region 34.

In cases where a peripheral region of the coating 30 is removed or omitted, the frit 150 preferably is deposited over such region. In the embodiment of FIG. 1, the peripheral region (or "edge region") of surface 24 is devoid of coating 30, and the frit 150 is provided on surface 24 here. Preferably, an inner portion of the frit 150 overlaps coating 30. It can optionally be the case that only an inner portion of the frit 150 overlaps coating 30. For example, in the non-limiting example shown in FIG. 1, an outer portion of the frit 150 is provided on (e.g., so as to contact) the peripheral region of surface 24 while an inner portion of the frit 150 is provided on (e.g., so as to contact) the coating 30.

In the embodiment of FIG. 2, some of the frit 150 fills the gap between the main region 32 and the peripheral region 34 of the coating 30. Because the frit 150 is electrically insulating, the main region 32 of the coating 30 is configured to receive electric current, whereas the peripheral region 34 of the coating 34 is not (i.e., it is electrically isolated). In this type of arrangement, both inner and outer portions of the frit 150 overlap the coating 30.

In preferred embodiments, the IG unit 10 includes a second bus bar 200. Similar to bus bar 100, the second bus bar 200 is spaced apart from the coating 30 and located over the desired surface of the selected pane 20. As shown in the non-limiting embodiment of FIG. 3, bus bar 100 can be located near a top of the selected pane 20, whereas second bus bar 200 can be located near a bottom of the selected pane 20. Alternatively, bus bar 100 can be located near a first side of the selected pane 20, whereas second bus bar 200 can be located near an opposite side of the selected pane 20.

By providing an IG unit 10 with both bus bar 100 and second bus bar 200, electric current can be delivered to bus bar 100 and subsequently delivered from second bus bar 200. The present disclosure is discussed mainly with reference to bus bar 100. However, skilled artisans will appreciate that the second bus bar 200 can generally have the same properties, features, and configuration as bus bar 100, except that it is located opposite bus bar 100. In some cases, there is a separate transparent conductor bridge 110 for each bus bar 100, 200. In other cases, a single transparent conductor bridge 110 extends around an entirety of the selected pane 20 such that the same transparent conductor bridge 110 extends over (e.g., and contacts) both bus bars 100, 200.

In one group of embodiments, the TCO film 40 is an indium tin oxide film. In these embodiments, the overcoat film 50 is located over (optionally directly over) the indium tin oxide film. In addition, the bus bar 100 is connected electrically to the indium tin oxide film by virtue of the transparent conductor bridge 110 extending from the bus bar 100 to the top surface 55 of the overcoat film 50. In the present group of embodiments, the bus bar 100 is located over (optionally directly over) a frit 150, which can be of the nature described above. As such, the frit 150 is located over (optionally directly over) surface 24 and extends around a perimeter of the surface 24.

Thus, in the present group of embodiments, the TCO film comprises ITO and frit 150 is provided. Otherwise, all the foregoing discussions apply to the present embodiment group. For example, the IG unit 10 includes second bus bar 200. In addition, both bus bar 100 and second bus bar 200 are spaced apart from the coating 30 and located over the desired surface 24 of the selected pane 20.

Figure 4:
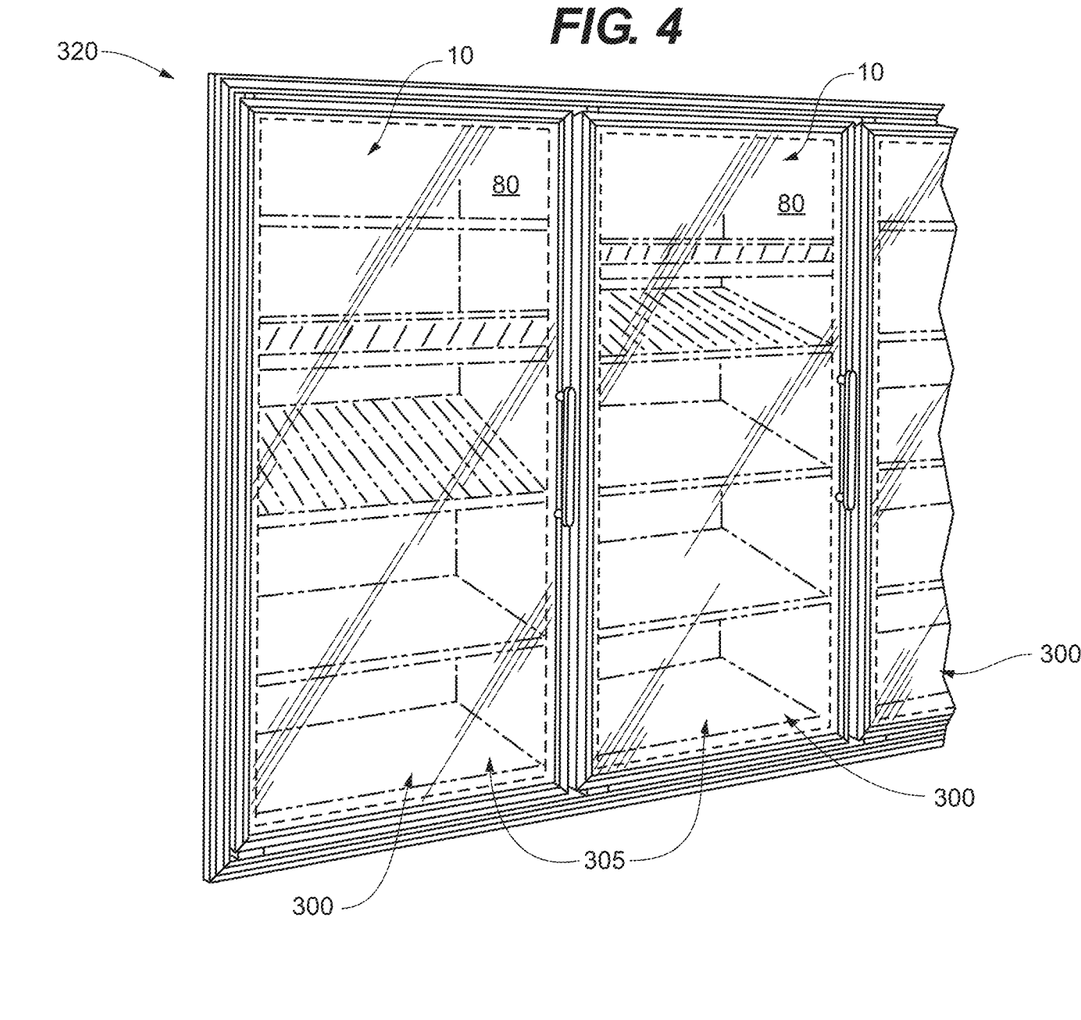
FIG. 4 is a partially broken-away schematic perspective view of a refrigerator including a door comprising a multiple-pane insulating glazing unit in accordance with certain embodiments of the present disclosure.

As can be appreciated by referring to FIG. 4, in some embodiments, the multiple-pane insulating glazing unit 10 is part of (e.g., is mounted so as to be a component of) a refrigerator door 300. The refrigerator door 300 has a closed configuration 305 and an open configuration. The IG unit 10 has both an interior face and an exterior face 80. In the present embodiments, the interior and exterior 80 faces are opposed, such that when the refrigerator door 300 is in the closed configuration 305, the interior face of the IG unit 10 is exposed to a refrigerated interior environment of a refrigerator 320 while the exterior face 80 is exposed to an ambient environment. In some embodiments of this nature, the selected pane 20 defines the exterior face 80 and thus is exposed to the ambient environment. For example, the desired surface of the selected pane can optionally be a #2 surface of the IG unit/refrigerator door and thus exposed to the noted between-pane space. As used herein, the term "refrigerator" refers to any structure (e.g., an appliance, a room, and/or a compartment) having a refrigerated interior environment. This definition includes both refrigerators and freezers.

In the present embodiments, the "first" (or #1) surface of the IG unit 10 is exposed to an ambient environment. The external surface of the outboard pane is the so-called first surface. Moving from the #1 surface inwardly toward the refrigerated interior environment, the next surface is the "second" (or "#2") surface. Thus, the internal surface of the outboard pane is the so-called second surface. Moving further inwardly toward the refrigerated interior environment, the next surface is the "third" (or "#3") surface, followed by the "fourth" (or "#4) surface. This convention is carried forward for IG units having more than four major pane surfaces.

In any embodiment of the present disclosure, the desired surface 24 of the selected pane 20 can optionally be a #2 surface of the IG unit 10 and thus exposed to a between-pane space of the IG unit 10. In some embodiments, the IG unit 10 includes more than one coating. In such cases, coatings can be provided, for example, on both the #2 surface and either the #3 surface or the #4 surface. If desired, a coating can also be provided on the #1 surface. For example, a conventional hydrophilic coating may be used.

The IG unit 10 can optionally be provided in the form of a triple glazing. In such embodiments, the IG unit 10 further comprises a third pane and a second between-pane space. As non-limiting examples of such embodiments, the coating 30 can be provided on the #2 surface, or on the #4 surface, or on the #6 surface.

Finally, certain embodiments provide a refrigerator 320 having a refrigerator door 300 of the type described above. In these embodiments, the multiple-pane insulating glazing unit 10 of the door 300 comprises two panes and a between-pane space. The between-pane space is located between the two panes. A desired surface 24 of a selected one of the two panes bears a coating 30 comprising both a transparent conductive oxide film 40 and an overcoat film 50. The overcoat film 50 is located over the transparent conductive oxide film 40. The coating 30 used in the present refrigerator 320 embodiments can be of the nature described above for any embodiment of the present disclosure. In addition, the IG unit used in the present refrigerator 320 embodiments can be of the nature described above for any embodiment of the present disclosure involving an IG unit 10.

Preferably, the desired surface 24 of the selected pane 20 faces toward the refrigerated interior environment of the refrigerator 320. In some cases, the desired surface 24 of the selected pane 20 is exposed to the refrigerated interior environment of the refrigerator 320. In other cases, the desired surface 24 of the selected pane 20 faces toward, but is not exposed to, the refrigerated interior environment of the refrigerator 320. For example, the desired surface 24 of the selected pane 20 may be a #2 surface of the IG unit 10, such that the selected pane 20 defines the exterior face 80 of the IG unit 10 and is therefore exposed to the ambient environment. This, however, is not the case in all the present embodiments. For example, the desired surface 24 of the selected pane 20 can alternatively be a #4 surface or a #6 surface.

Preferably, the IG unit 10 of the refrigerator door 300 comprises a frit 150, a bus bar 100, and a transparent conductor bridge 110 each located over the desired surface 24. When provided, the frit 150 preferably extends around (optionally entirely around) a perimeter of the desired surface 24. The bus bar 100 is located over the frit 150 and is spaced apart from the coating 30. The bus bar 100 is connected electrically to the transparent conductive oxide film 40 by virtue of the transparent conductor bridge 110 extending from the bus bar 100 to the top surface 55 of the overcoat film 50.

In embodiments of this nature, the outer region 115 of the transparent conductor bridge 110 preferably is in contact with the bus bar 100, and an inner region 120 of the transparent conductor bridge 110 preferably is in contact with the top surface 55 of the overcoat film 50. In some cases, the inner region 120 of the transparent conductor bridge 110 is positioned within the vision area 130 of the IG unit 10/refrigerator door 300, while the bus bar 100 is positioned outside the vision area 130. Furthermore, the transparent conductor bridge 110 preferably has first 112, second 114, and third 116 regions of the nature described above.

Figure 5:
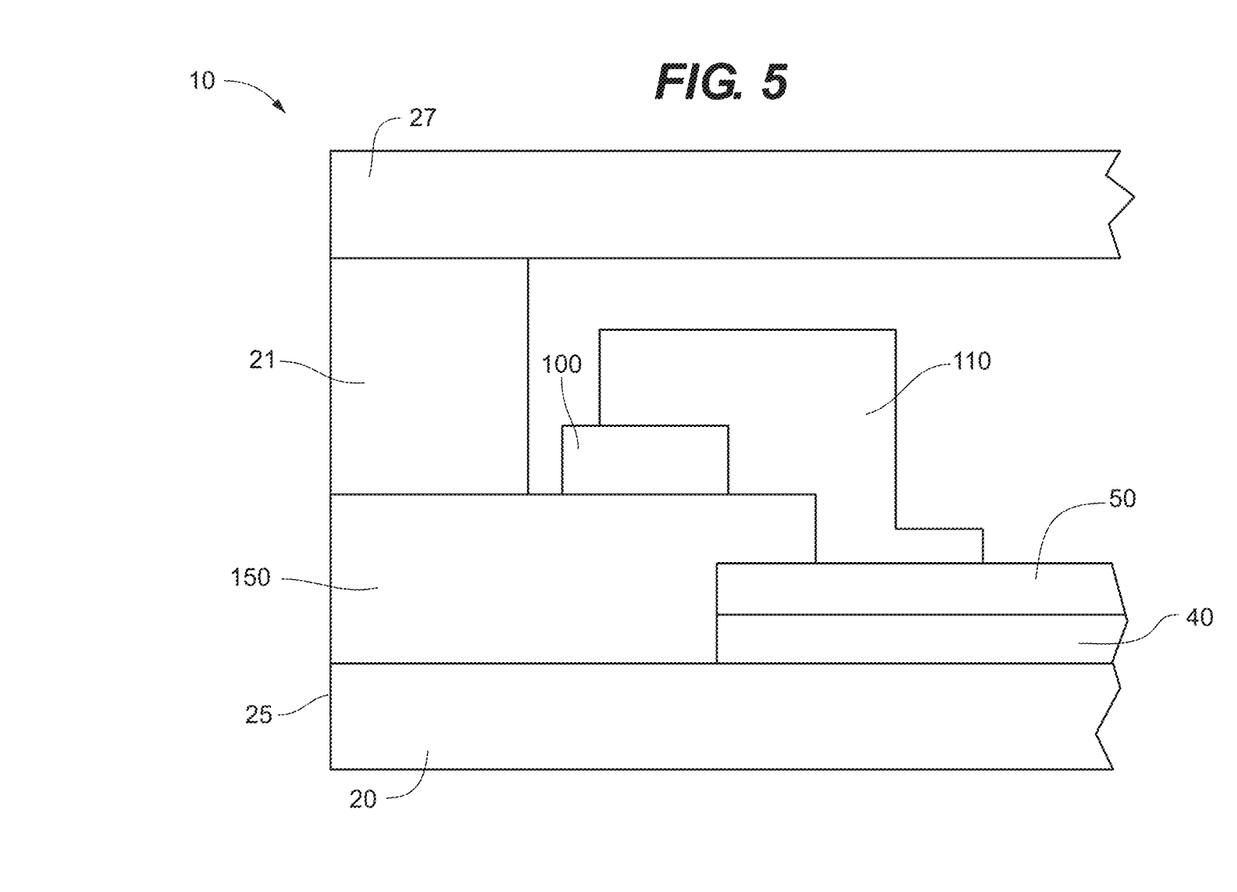
FIG. 5 is a partially broken-away schematic cross-sectional view of an insulating glazing unit in accordance with certain embodiments of the present disclosure.
Figure 6:
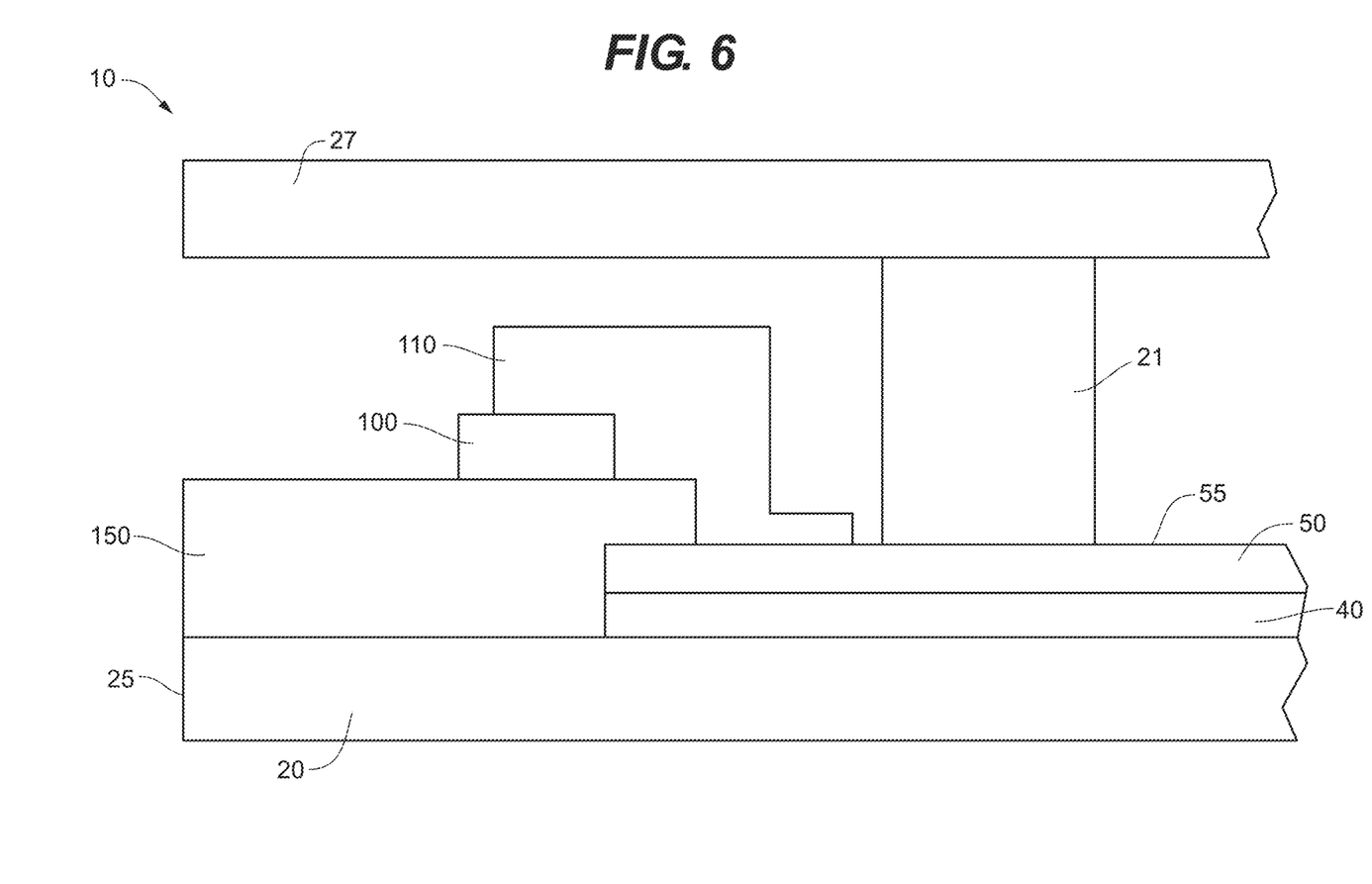
FIG. 6 is a partially broken-away schematic cross-sectional view of an insulating glazing unit in accordance with some other embodiments of the present disclosure.
Figure 7:
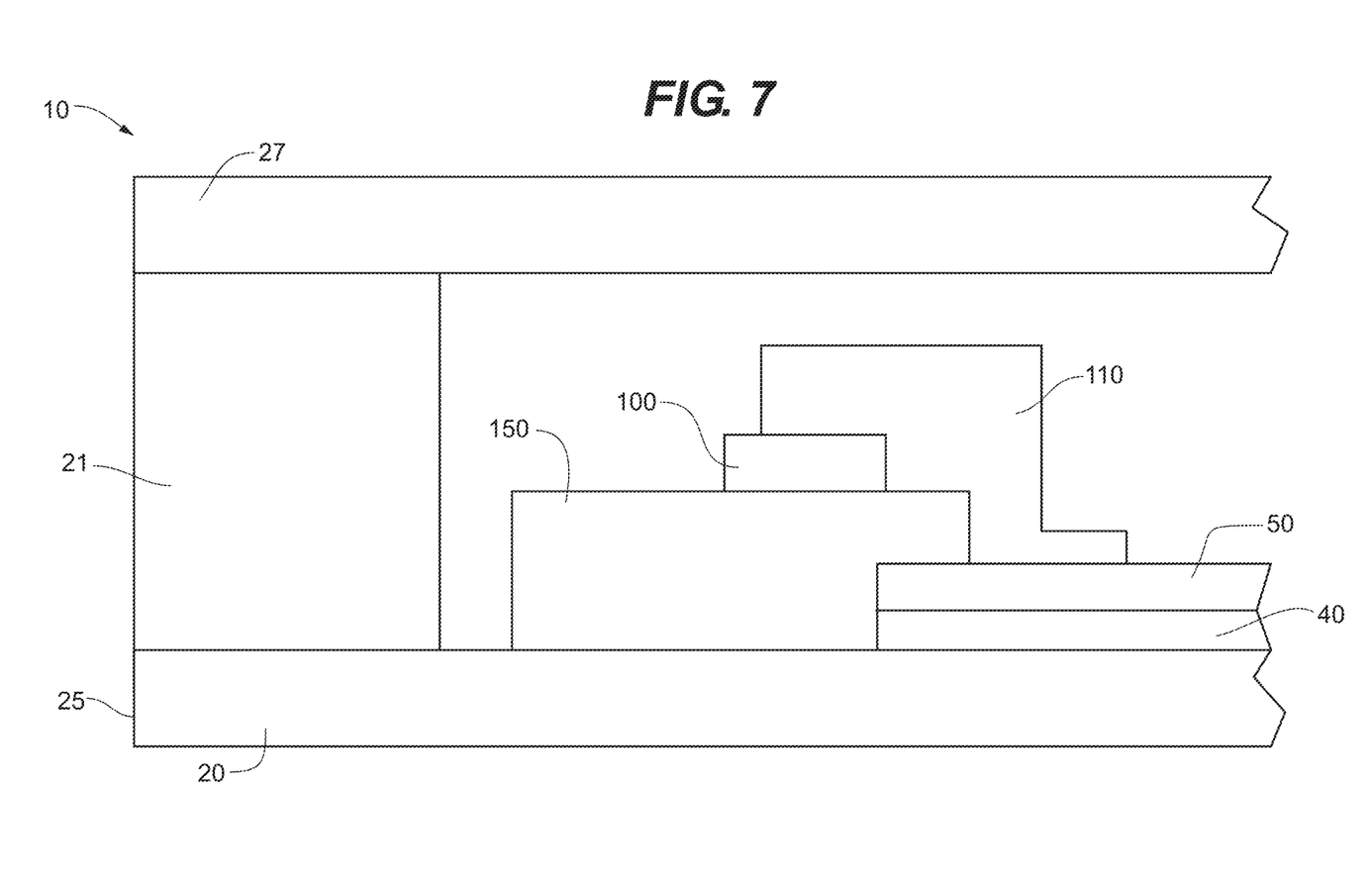
FIG. 7 is a partially broken-away schematic cross-sectional view of an insulating glazing unit in accordance with still other embodiments of the present disclosure.

FIGS. 5-7 are example embodiments of IG units 10 of the present disclosure, showing a spacer 21 provided in various configurations. In some cases, the spacer 21 is located nearer to the edge 25 of the selected pane 20 than are the transparent conductor bridge 110 and the bus bar 100. Reference is made to FIGS. 5 and 7. In other cases, the bus bar 100 and the transparent conductor bridge 110 are located nearer to the edge 25 of the selected pane 20 than is the spacer 21. Reference is made to FIG. 6.

In more detail, FIG. 5 shows an arrangement where the spacer 21 extends between the frit 150 and the second pane 27. In such cases, the bus bar 100 and the transparent conductor bridge 110 are spaced laterally inwardly from the spacer 21 relative to the adjacent edge 25 of the selected pane 20. Thus, the spacer 21 can optionally be directly on (so as to contact) the frit 150. In other embodiments, as shown in FIG. 6, the spacer 21 extends between the top surface 55 of the overcoat film 50 and the second pane 27. In still other embodiments, the frit 150, the bus bar 100, and the transparent conductor bridge 110 are spaced laterally inwardly from the spacer 21 relative to the adjacent edge 25 of the selected pane 20 (FIG. 7). Skilled artisans will appreciate that that alternative spacer arrangements can be provided, and that the described embodiments are by no means limiting.

While some preferred embodiments of the invention have been described, it should be understood that various changes, adaptations and modifications may be made therein without departing from the spirit of the invention and the scope of the appended claims.

What is claimed is:

1. A multiple-pane insulating glazing unit comprising two panes and a between-pane space, the between-pane space being located between the two panes, wherein a desired surface of a selected one of the two panes bears a coating comprising both a transparent conductive oxide film and an overcoat film, the overcoat film being located over the transparent conductive oxide film, the multiple-pane insulating glazing unit further comprising a bus bar and a transparent conductor bridge each located over the desired surface, the bus bar being spaced apart from the coating, the bus bar being connected electrically to the transparent conductive oxide film by virtue of the transparent conductor bridge extending from the bus bar to a top surface of the overcoat film.

2. The multiple-pane insulating glazing unit of claim 1 wherein an outer region of the transparent conductor bridge is in contact with the bus bar, and an inner region of the transparent conductor bridge is in contact with the top surface of the overcoat film.

3. The multiple-pane insulating glazing unit of claim 2 wherein the inner region of the transparent conductor bridge is positioned within a vision area of the multiple-pane insulating glazing unit.

4. The multiple-pane insulating glazing unit of claim 1 wherein the overcoat film is a transparent dielectric film such that the transparent conductor bridge is in contact with the transparent dielectric film.

5. The multiple-pane insulating glazing unit of claim 1 further comprising a frit, the frit being located over the desired surface and extending around a perimeter thereof, the bus bar being located over the frit.

6. The multiple-pane insulating glazing unit of claim 5 wherein the frit has two opposed lateral sides, and the bus bar is sized and positioned relative to the frit such that no portion of the bus bar extends laterally beyond either of the two lateral sides of the frit.

7. The multiple-pane insulating glazing unit of claim 6 wherein the bus bar has a lateral width that is smaller than a lateral width of the frit.

8. The multiple-pane insulating glazing unit of claim 5 wherein a first region of the transparent conductor bridge is in contact with the bus bar, a second region of the transparent conductor bridge is in contact with the frit, and a third region of the transparent conductor bridge is in contact with the top surface of the overcoat film.

9. The multiple-pane insulating glazing unit of claim 8 wherein the selected pane has an edge at a perimeter of the desired surface, the first region of the transparent conductor bridge being closer to the edge of the selected pane than are the second and third regions of the transparent conductor bridge, and the second region of the transparent conductor bridge being closer to the edge of the selected pane than is the third region of the transparent conductor bridge.

10. The multiple-pane insulating glazing unit of claim 9 wherein the frit surrounds a vision area of the multiple-pane insulating glazing unit, and the third region of the transparent conductor bridge is positioned within the vision area.

11. The multiple-pane insulating glazing unit of claim 10 wherein the bus bar is positioned outside the vision area.

12. The multiple-pane insulating glazing unit of claim 11 wherein part of the transparent conductor bridge is positioned outside the vision area.

13. The multiple-pane insulating glazing unit of claim 1 wherein the transparent conductor bridge has a printed bridge structure overlying both the bus bar and the coating.

14. The multiple-pane insulating glazing unit of claim 1 wherein the transparent conductor bridge comprises a transparent conductive oxide.

15. The multiple-pane insulating glazing unit of claim 1 wherein the transparent conductor bridge comprises tin oxide.

16. The multiple-pane insulating glazing unit of claim 1 wherein the transparent conductive oxide film has a sheet resistance of between 10 ohms/square and 2,000 ohms/square.

17. The multiple-pane insulating glazing unit of claim 1 wherein the transparent conductive oxide film has a thickness in a range of from about 100 Å to about 1,350 Å.

18. The multiple-pane insulating glazing unit of claim 1 wherein the transparent conductive oxide film has a thickness of greater than 100 Å but less than 1,000 Å.

19. The multiple-pane insulating glazing unit of claim 18 wherein the overcoat film comprises transparent dielectric film and has a thickness in a range of from about 50 Å to about 900 Å.

20. The multiple-pane insulating glazing unit of claim 1 wherein the transparent conductive oxide film comprises indium tin oxide.

21. The multiple-pane insulating glazing unit of claim 1 wherein the overcoat film is formed of oxide film, nitride film, and/or oxynitride film.

22. The multiple-pane insulating glazing unit of claim 1 wherein the transparent conductive oxide film comprises indium tin oxide and the overcoat film comprises silicon oxynitride.

23. The multiple-pane insulating glazing unit of claim 1 wherein the overcoat film is in contact with the transparent conductive oxide film.

24. The multiple-pane insulating glazing unit of claim 1 wherein perforations are present in the overcoat film at locations where the transparent conductor bridge contacts the overcoat film.

25. The multiple-pane insulating glazing unit of claim 1 further comprising a second bus bar, the second bus bar being spaced apart from the coating and located over the desired surface of the selected pane.

26. The multiple-pane insulating glazing unit of claim 1 further comprising a third pane and a second between-pane space.

27. The multiple-pane insulating glazing unit of claim 1 wherein the multiple-pane insulating glazing unit is part of a refrigerator door that has a closed configuration and an open configuration, the multiple-pane insulating glazing unit having an interior face and an exterior face, the interior and exterior faces being opposed, the refrigerator door being in the closed configuration such that the interior face of the multiple-pane insulating glazing unit is exposed to a refrigerated interior environment of a refrigerator while the exterior face is exposed to an ambient environment.

28. The multiple-pane insulating glazing unit of claim 27 wherein the selected pane defines the exterior face and thus is exposed to the ambient environment.

29. The multiple-pane insulating glazing unit of claim 28 wherein the desired surface of the selected pane is a #2 surface of the multiple-pane insulating glazing unit and is exposed to the between-pane space.

30. The multiple-pane insulating glazing unit of claim 1 wherein the selected pane has an edge at a perimeter of the desired surface, the multiple-pane insulating glazing unit further including a spacer between the two panes, the spacer being located nearer to the edge of the selected pane than are the bus bar and the transparent conductor bridge.

31. The multiple-pane insulating glazing unit of claim 30 further comprising a frit, the frit being located over the desired surface and extending around a perimeter thereof, the bus bar being located over the frit, wherein the two panes are a first pane and a second pane, the first pane being the selected one of the two panes, the spacer extending between the frit and the second pane, the bus bar and the transparent conductor bridge being spaced laterally inwardly from the spacer relative to the edge of the selected pane.

32. A multiple-pane insulating glazing unit comprising two panes and a between-pane space, the between-pane space being located between the two panes, wherein a desired surface of a selected one of the two panes bears a coating comprising both an indium tin oxide film and an overcoat film, the overcoat film being located over the indium tin oxide film, the multiple-pane insulating glazing unit further comprising a bus bar and a transparent conductor bridge each located over the desired surface, the bus bar being spaced apart from the coating, the bus bar being connected electrically to the indium tin oxide film by virtue of the transparent conductor bridge extending from the bus bar to a top surface of the overcoat film, the multiple-pane insulating glazing unit further comprising a frit, the frit being located over the desired surface and extending around a perimeter thereof, the bus bar being located over the frit.

33. The multiple-pane insulating glazing unit of claim 32 further comprising a second bus bar, the second bus bar being spaced apart from the coating and located over the desired surface of the selected pane.

34. The multiple-pane insulating glazing unit of claim 32 wherein the selected pane has an edge at a perimeter of the desired surface, the multiple-pane insulating glazing unit further including a spacer between the two panes, the spacer being located nearer to the edge of the selected pane than are the bus bar and the transparent conductor bridge.

35. The multiple-pane insulating glazing unit of claim 34 wherein the two panes are a first pane and a second pane, the first pane being the selected one of the two panes, the spacer extending between the frit and the second pane, the bus bar and the transparent conductor bridge being spaced laterally inwardly from the spacer relative to the edge of the selected pane.

36. A refrigerator having a door comprising a multiple-pane insulating glazing unit, the refrigerator having a refrigerated interior environment, the door having an open configuration and a closed configuration, the multiple-pane insulating glazing unit having an interior face and an exterior face, the interior and exterior faces being opposed, such that when the door is in the closed configuration the interior face is exposed to the refrigerated interior environment while the exterior face is exposed to an ambient environment, the multiple-pane insulating glazing unit comprising two panes and a between-pane space, the between-pane space being located between the two panes, wherein a desired surface of a selected one of the two panes bears a coating comprising both a transparent conductive oxide film and an overcoat film, the overcoat film being located over the transparent conductive oxide film, the multiple-pane insulating glazing unit further comprising a frit, a bus bar, and a transparent conductor bridge each located over the desired surface, the frit extending around a perimeter of the desired surface, the bus bar being located over the frit and being spaced apart from the coating, the bus bar being connected electrically to the transparent conductive oxide film by virtue of the transparent conductor bridge extending from the bus bar to a top surface of the overcoat film.

37. The refrigerator of claim 36 wherein the desired surface of the selected pane faces toward the refrigerated interior environment of the refrigerator.

38. The refrigerator of claim 36 wherein the desired surface of the selected pane is a #2 surface of the multiple-pane insulating glazing unit, such that the selected pane defines the exterior face of the multiple-pane insulating glazing unit and is therefore exposed to the ambient environment.

39. The refrigerator of claim 36 wherein an outer region of the transparent conductor bridge is in contact with the bus bar, and an inner region of the transparent conductor bridge is in contact with the top surface of the overcoat film, the inner region of the transparent conductor bridge being positioned within a vision area of the multiple-pane insulating glazing unit, while the bus bar is positioned outside the vision area.

* * * * *